(12) United States Patent
Fair et al.

(10) Patent No.: US 6,905,543 B1
(45) Date of Patent: Jun. 14, 2005

(54) METHODS OF FORMING TUNGSTEN NUCLEATION LAYER

(75) Inventors: James A. Fair, Mountain View, CA (US); Nerissa Taylor, Milpitas, CA (US); Junghwan Sung, Santa Clara, CA (US)

(73) Assignee: Novellus Systems, Inc, San Jose, CA (US)

( * ) Notice: Subject to any disclaimer, the term of this patent is extended or adjusted under 35 U.S.C. 154(b) by 208 days.

(21) Appl. No.: 10/174,628

(22) Filed: Jun. 19, 2002

(51) Int. Cl.[7] ............................................. C30B 25/14
(52) U.S. Cl. ..................... 117/89; 117/92; 427/250; 427/253; 427/255.28; 427/255.39
(58) Field of Search .............................. 438/648, 656, 438/675, 680, 685; 117/84, 89, 92; 427/250, 253, 255.28, 255.39

(56) References Cited

U.S. PATENT DOCUMENTS

| | | | |
|---|---|---|---|
| 6,110,278 A | * | 8/2000 | Saxena .......................... 117/95 |
| 6,156,382 A | | 12/2000 | Rajagopalan et al. |
| 6,524,956 B1 | * | 2/2003 | Tian et al. .................. 438/685 |

* cited by examiner

Primary Examiner—Felisa Hiteshew
(74) Attorney, Agent, or Firm—Silicon Valley Patent Group LLP (57) ABSTRACT

The nucleation delay in the formation of a tungsten layer on a substrate is reduced or eliminated by alternative processes. In one process the substrate is exposed to atomic hydrogen before the tungsten nucleation layer is formed. In the other process the substrate is exposed to a boron hydride such as diborane ($B_2H_6$) before the nucleation layer is formed. The process works effectively to reduce or eliminate the tungsten nucleation delay on a variety of surfaces, including silicon, silicon dioxide, silicon nitride and titanium nitride.

34 Claims, 8 Drawing Sheets

Prior Art

Sheet Resistance - Untreated Wafers

Fig. 8A

Sheet Resistance - Diborane Pretreated Wafers

Fig. 8B

Reflectivity - Untreated Wafers
Fig 9A

Reflectivity - Diborane Pretreated Wafers
Fig. 9B

Average Resistivity - Untreated Wafers
Fig. 10A

Average Resistivity - Diborane Pretreated Wafers
Fig. 10B

Fluorine Concentration in Ti Layer After Deposition of Tungsten Nucleation Layer on Ti/TiN Substrate

Fig. 11

METHODS OF FORMING TUNGSTEN NUCLEATION LAYER

FIELD OF THE INVENTION

This invention relates to methods of depositing a tungsten layer in the fabrication of integrated circuits and, in particular, methods of forming a tungsten nucleation layer.

BACKGROUND OF THE INVENTION

Tungsten is used to form conductive lines in integrated circuit (IC) devices. Because the resistivity of tungsten is higher than the resistivity of aluminum or copper, the use of tungsten has generally been relegated to filling vertical features such as vias and trenches and local interconnects. Tungsten has an advantage over aluminum and copper in that tungsten does not tend to migrate into and contaminate the silicon or dielectric layers of the device. Copper in particular is highly contaminating and barrier layers must be provided to prevent the copper from contaminating the silicon and dielectric layers. Moreover, aluminum and copper must be sputtered or electroplated onto the substrate, whereas tungsten can be deposited by chemical vapor deposition (CVD).

One problem with tungsten, however, is that it is relatively difficult to get tungsten to start depositing on a substrate (e.g., a semiconductor wafer or oxide layer). Before tungsten will begin to deposit in bulk quantity, a "nucleation" or "seed" layer must be formed on the underlying material. In a CVD process, even after the tungsten-containing gas is introduced into the reaction chamber, a period of time typically elapses before a tungsten nucleation layer begins to form. This time lapse is often referred to as the "nucleation delay". The nucleation delay may vary from wafer to wafer and from location to location on a single wafer. The resulting tungsten layer is correspondingly non-uniform (i.e., thicker in the areas where nucleation began first and thinner in areas where nucleation began later).

Several techniques have been proposed for reducing the nucleation delay. One standard technique is to bombard the substrate with ions generated by a plasma. The plasma can be formed in a plasma-enhanced chemical vapor deposition (PECVD) chamber. A disadvantage of this technique is that the ion bombardment is highly directional in nature and tends to be directed primarily at flat horizontal surfaces rather than vertical surfaces such as the sidewalls of a trench or via. The nucleation layer thus begins preferentially on the flat horizontal surfaces, with the result that the nucleation is uneven and the step coverage is poor. The resulting tungsten layer tends to look like tungsten layer 10, shown in FIG. 1, which has formed on the horizontal surfaces and on the upper sidewalls of via 12 but is virtually nonexistent on the lower sidewalls and floor of via 12. As the deposition of the tungsten layer continues, tungsten layer 10 may close off the mouth of the via and leave a void in the lower part of the via.

Figure 2:
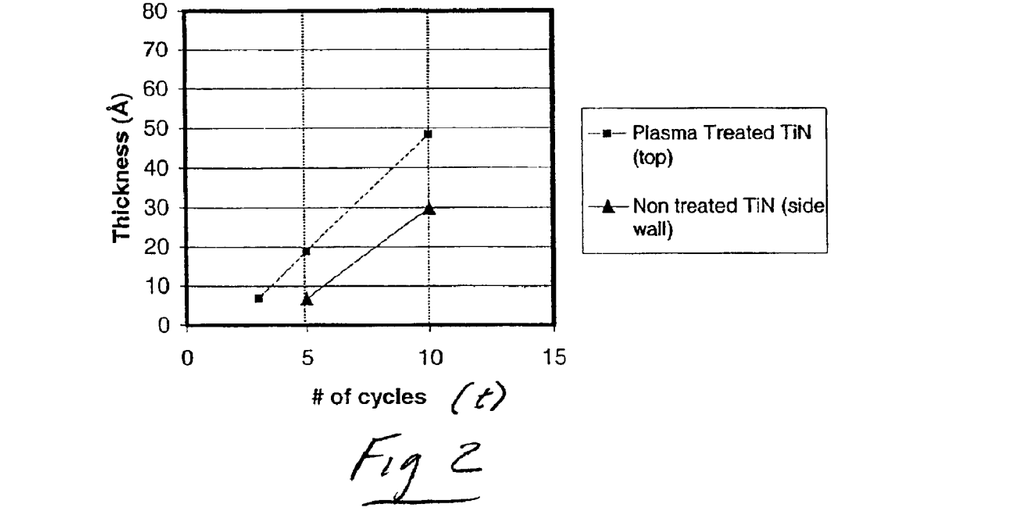
FIG. 2 is a graph showing how the nucleation delay varies in different regions of the substrate.

FIG. 2 is a graph showing how the tungsten nucleation layer develops as a function of the number of cycles (which is equivalent to time). The vertical axis is the thickness of the tungsten nucleation layer in Å. The dashed line depicts the formation of the nucleation layer on the plasma-treated horizontal surfaces and the solid line depicts the formation of the nucleation layer on the side walls of via 12. As is evident, the nucleation delay is very different in these two areas.

Accordingly, there is a clear need for improved methods of forming a tungsten nucleation layer and in particular reducing the nucleation delay.

SUMMARY OF THE INVENTION

In one method according to this invention, a substrate is placed in a reaction chamber and the substrate is exposed to atomic hydrogen. After the substrate has been exposed to the atomic hydrogen, a tungsten-containing gas is introduced into the reaction chamber so as to form a tungsten nucleation layer on the substrate. The atoms of hydrogen, unlike ions, have an isotropic velocity distribution and bounce around randomly, colliding with the horizontal and vertical surfaces of the substrate alike. As a result, the subsequent tungsten nucleation layer forms relatively evenly over the horizontal and vertical surfaces of the substrate, and this in turn produces a highly uniform bulk tungsten layer.

According to another aspect of this invention, the substrate is exposed to a boron hydride-containing gas, such as $B_2H_6$, before the tungsten nucleation layer is formed. The boron hydride pretreatment renders the surface of the substrate highly active and in many cases this essentially eliminates the nucleation delay. The boron hydride pretreatment is effective on a wide variety of surfaces, including, for example, silicon, silicon dioxide, silicon nitride and titanium nitride.

DESCRIPTION OF THE INVENTION

Figure 3:
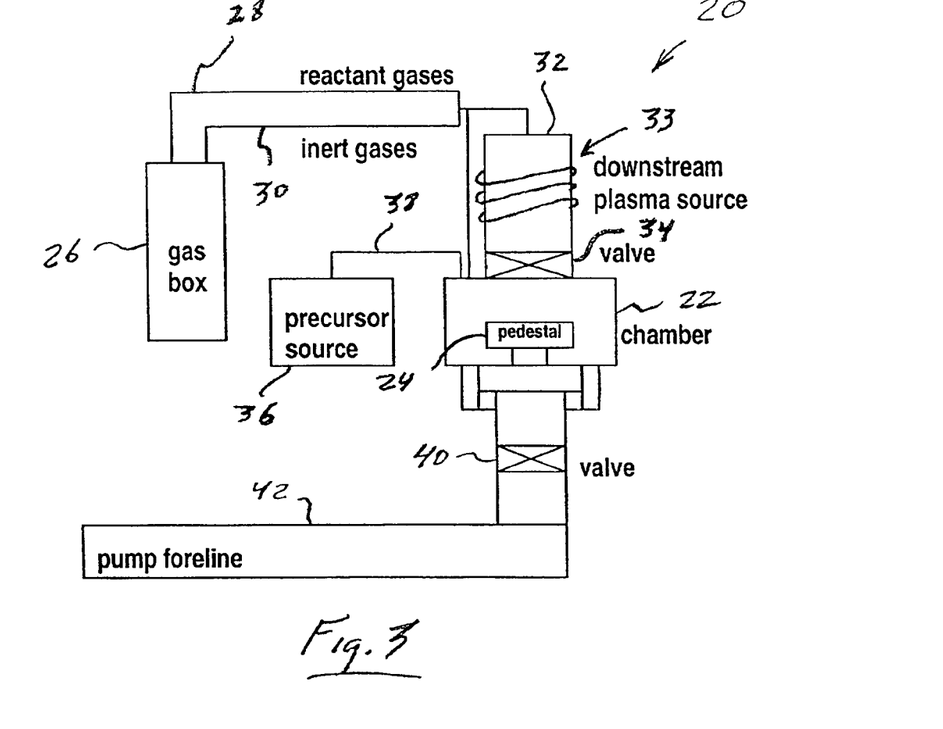
FIG. 3 is a schematic diagram of a chemical vapor deposition reactor in which the method of this invention can be performed.

FIG. 3 is a schematic diagram of a chemical vapor deposition (CVD) reactor 20 in which the method of this invention can be performed. CVD reactor 20 includes a reaction chamber 22 in which a pedestal 24 for holding a semiconductor wafer or other substrate is contained. Reactant gases and inert gases are fed into chamber 22 from a gas box 26 through gas lines 28 and 30, which connect to a downstream plasma source 32. Downstream plasma source 32 is connected to chamber 22 via a valve 34. A tungsten-containing gas such as tungsten hexafluoride ($WF_6$) originates from a precursor source 36, which connects to chamber 22 via a line 38.

Downstream from chamber 22 is a valve 40, which leads to a pump foreline 42. An exhaust pump (not shown) connected to pump foreline 42 is used to remove gases from chamber 22.

In the process of this invention, a semiconductor wafer or other substrate is placed on pedestal 24. The pressure in reaction chamber 22 is set at 0.3–40 Torr and temperature is set in the range of 50–350° C., preferably 1.0 torr and 300° C.

Molecular hydrogen ($H_2$) is introduced into downstream plasma source 32 at a flow rate of 100–1000 sccm. Downstream plasma source 32 generates atomic hydrogen (H), which flows through valve 34 into reaction chamber 22, exposing the substrate to the atomic hydrogen. After about 20 seconds, the hydrogen flow is stopped, and silane ($SiH_4$) is introduced into reaction chamber 22 from gas box 26. The flow of $SiH_4$ may continue from 1 to 30 seconds, for example. The pressure is typically set at 1 Torr during the silane soak.

The silane flow is terminated, and tungsten hexafluoride ($WF_6$) introduced from precursor source 36, along with silane from gas box 26, to begin the formation of a tungsten nucleation layer. The flow rates of both the $WF_6$ and silane are maintained at 50–200 sccm. The temperature is maintained at 50–350° C. This step is typically continued until the tungsten nucleation layer reaches a thickness of 50–100 Å. The $WF_6$ and $SiH_4$ can be supplied together, as in CVD, or $WF_6$ and $SiH_4$ can be supplied alternately, as in atomic layer deposition (ALD).

After the tungsten nucleation layer has formed, $WF_6$ from precursor source 36 and $H_2$ from gas box 26 are introduced into reaction chamber 22, forming a bulk layer of tungsten. The flow rate of the $WF_6$ is maintained at typically 50 sccm and the $H_2$ is flowed at typically 1000 sccm. The pressure during the bulk deposition is increased to over 40 Torr. The combined thickness of the tungsten nucleation and bulk layers could be in the range of 2000–3000 Å, for example.

Optionally, argon can be used as a carrier gas for the silane and $WF_6$ during the process. The total flow rate of the argon maybe in the range of 500–1500 sccm.

Figure 4:
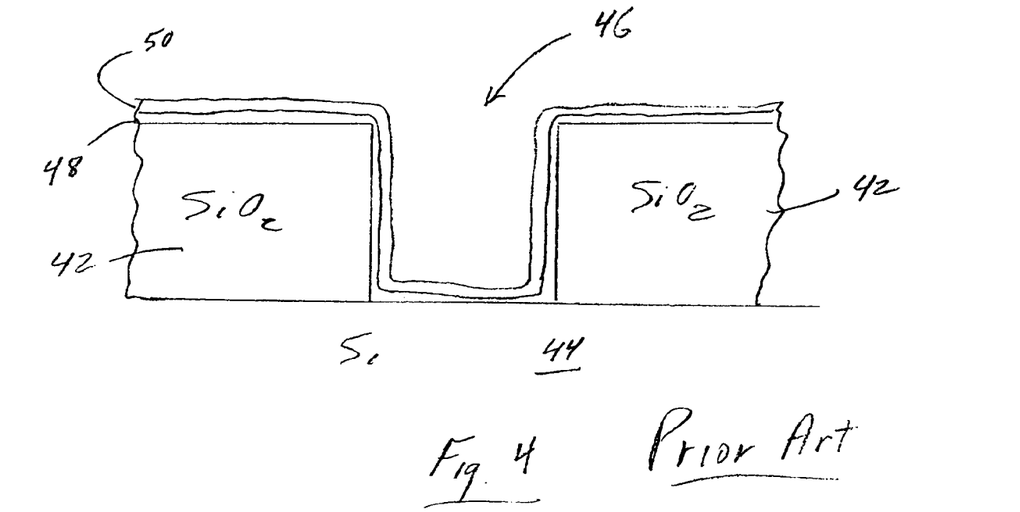
FIG. 4 shows a substrate on which titanium and titanium nitride layers have been formed in preparation for the deposition of a tungsten nucleation layer.

The tungsten film is typically deposited on a layer of titanium nitride (TiN). FIG. 4 shows a structure which includes a silicon dioxide layer 42 deposited on a silicon substrate 44. A via or trench 46 is formed in silicon dioxide layer 42. Since tungsten does not adhere well to silicon dioxide, a titanium layer 48 and a titanium nitride layer 50 are deposited over silicon dioxide layer 42. Titanium layer 48 could be 150 Å thick and titanium nitride layer 50 could be 100 Å thick, for example. The tungsten nucleation layer is formed on titanium nitride layer 50 as described above.

The downstream plasma source 32 can be operated in either an RF or DC discharge mode. If an RF discharge source is used, the electrodes can be located either inside the discharge region or external to the discharge region. The RF energy can be coupled to the plasma capacitively or inductively, or a combination of both. As shown in FIG. 3, downstream plasma source 32 can be formed of a quartz tube with a coil 33 wrapped around it. The coil is powered by a 13.56 MHz RF generator, such as a Model RFG 1251 CE, available from Advanced Energy of Fort Collins, Colo. The power is generally set at 200–500 W. Instead of using a downstream plasma source, the plasma may alternatively be created within the reaction chamber 22.

The plasma creates a variety of species, including molecular hydrogen ($H_2$), hydrogen ions ($H_2^+$, $H^+$), hydrogen atoms (H) and electrons ($e^-$). All of the ionic species have very short lifetimes and tend to combine with free electrons and disappear. Substantially the only species that emerge from the downstream plasma source in quantity are $H_2$ and H.

Pretreating the substrate with atomic hydrogen before the formation of the tungsten nucleation layer reduces the nucleation delay and makes the nucleation layer more uniform. As a result, more uniform and smoother bulk tungsten films are formed. Moreover, after the plasma treatment the nucleation layer process may be carried out at a wide range of temperatures, for example, anywhere from near room temperature, 50° C., up to 350° C. Without pretreatment temperatures in excess of 300° C. are required. Reducing the temperature from the normal level (typically over 400° C.) decreases the reactivity of the substrate to the fluorine that is generated from the $WF_6$. At an elevated temperature the fluorine tends to react with the titanium nitride layer or, worse yet, can penetrate the titanium nitride layer and react with the titanium layer. Titanium reacts with fluorine quite readily.

The atomic hydrogen may be produced by means other than a downstream plasma source. For example, a high temperature source such as a hot filament can be used to generate atomic hydrogen, or a variety of light sources such as an ultraviolet lamp or a laser can be used. See, e.g., U. Bischler and E. Bertel, "Simple source of atomic hydrogen for ultrahigh vacuum applications", *Vac. Sci. Technol. A* 11(2), March/April 1993, and Brockhoff AM. van der Weg WF. Habraken FHPM. "Hot-wire produced atomic hydrogen: effects during and after amorphous-silicon deposition", *Thin Solid Films,* 395(1–2):87–91, 2001 Sep. 3, each of which is incorporated by reference herein.

Figure 5:
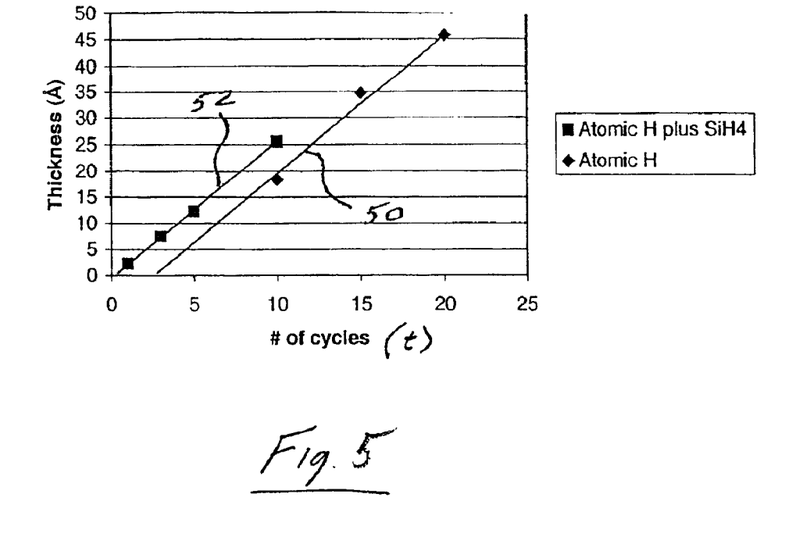
FIG. 5 shows the formation of a tungsten nucleation layer after the substrate has been treated with atomic hydrogen in accordance with this invention.

FIG. 5 is a graph showing the growth rate of a tungsten nucleation layer as a function of the number of cycles, which is equivalent to time. When the substrate was exposed to atomic hydrogen for 20 seconds, the tungsten nucleation layer began to form after approximately 2½ cycles. When in addition the substrate was exposed to silane for 30 seconds after the atomic hydrogen pretreatment, the nucleation delay was reduced to essentially zero.

An alternative technique for effectively eliminating the nucleation delay of a tungsten layer is to expose the substrate to a boron hydride such as diborane ($B_2H_6$). This process may be performed, for example, in an Altus™ reactor, available from Novellus Systems, Inc., of San Jose, Calif. The substrate, preferably after titanium and titanium nitride layers have been formed as described above, is placed on pedestal 24. The pressure may be from 1 to 40 Torr, and the temperature may be from 200 to 350° C. Again, argon may be introduced as a carrier gas for the precursor and reactive gases at a total flow rate of 500 to 1500 sccm. A gas containing diborane is introduced at a flow rate of 50 to 200 sccm for one second, for example. The diborane is then exhausted from reaction chamber 22. A tungsten nucleation layer can then be formed by introducing $WF_6$ and $SiH_4$ as described above, and a bulk tungsten layer can be formed be introducing $WF_6$ and $H_2$.

Figure 6:
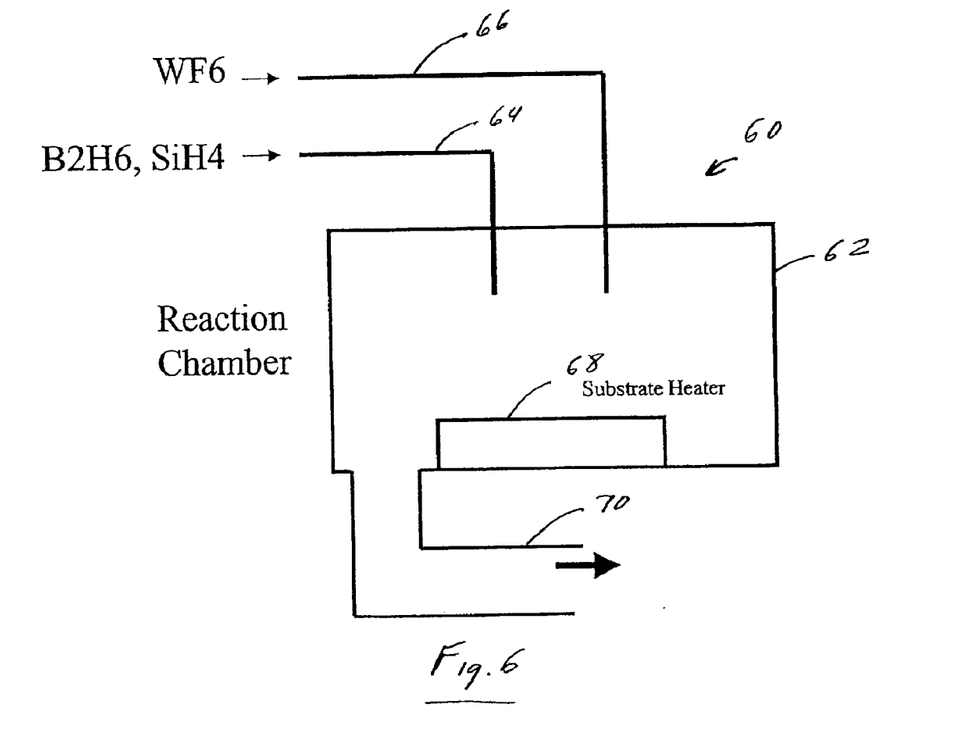
FIG. 6 is a schematic diagram of an atomic layer deposition chamber that can be used to deposit a tungsten nucleation layer in accordance with this invention.

The tungsten nucleation layer may also be formed with an atomic layer deposition (ALD) reactor of the kind shown in FIG. 6. ALD reactor 60 includes a reaction chamber 62, input lines 64, 66, and an exhaust line 70. A semiconductor wafer or other substrate is placed on a heated pedestal 68. In an ALD process according to this invention, a substrate is placed on pedestal 68 and is exposed to diborane through line 64 for one second under the process conditions described above. Following the diborane exposure, tungsten is deposited one atomic layer at a time. The pedestal 68 is held at a temperature in the range of 50–350° C., the pressure is set at about 1 Torr, and $WF_6$ is introduced through line 66 at a flow rate of 50 sccm, for example. This produces essentially a single layer of tungsten atoms with attached fluorine atoms. The flow of $WF_6$ is stopped, and $SiF_4$ is introduced through line 64 at a flow rate of 50 sccm. The $SiH_4$ reacts with the dangling fluorine atoms to form $SiF_4$ and $H_2$, leaving a single atomic layer of essentially pure tungsten. The flow of $SiH_4$ is terminated, and $WF_6$ is reintroduced to form a second atomic layer of tungsten with attached fluorine atoms. Again, the fluorine atoms are removed with $SiH_4$. This process is repeated, building up a tungsten film one layer at a time, until a nucleation layer having a desired thickness (e.g., 50–100 Å) is reached.

$WF_6$ and $H_2$ are then introduced into reaction chamber 62 to form a bulk tungsten film in a normal CVD process. The temperature may be set at 350° C. and the pressure at 40 Torr, for example, during the formation of the bulk tungsten layer. The bulk tungsten layer could be in the range of 2000–3000 Å thick.

Optionally, a silane soak as described above can be performed after the diborane pretreatment.

Figure 1:
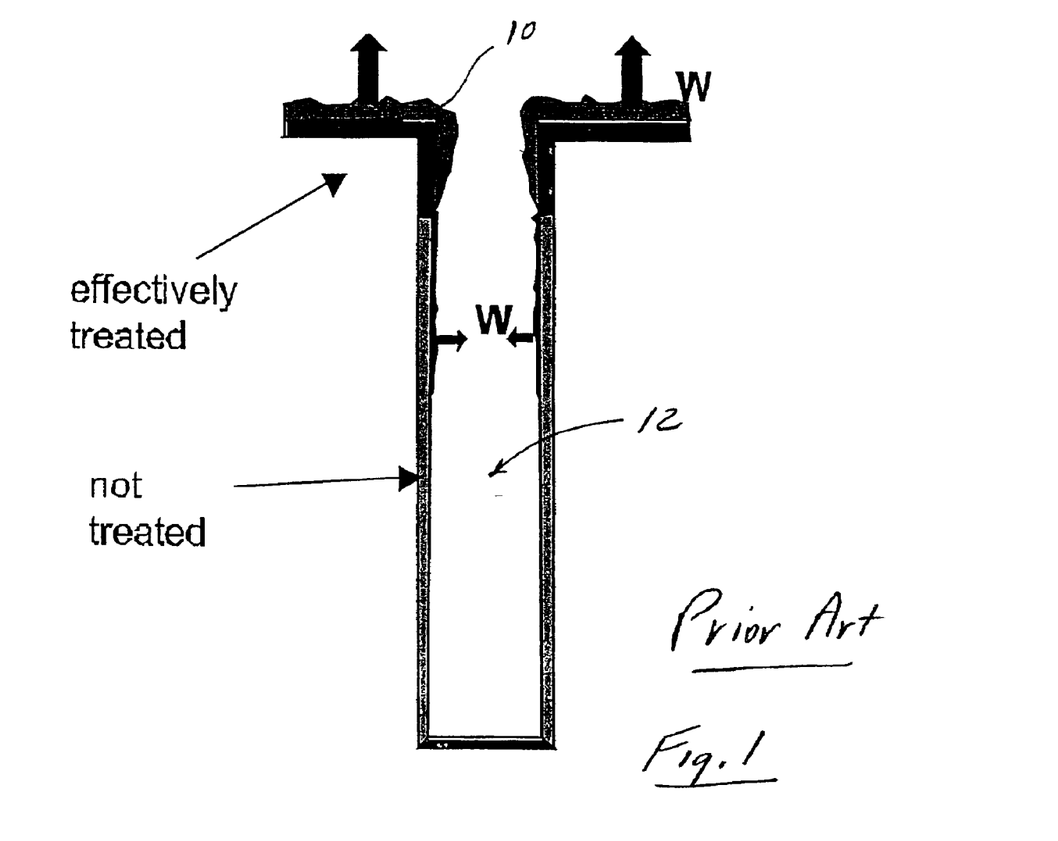
FIG. 1 illustrates a non-uniform tungsten layer formed when a substrate including a via is bombarded with ions generated by a plasma in order to reduce the nucleation delay.

The ALD process provides a very uniform layer of tungsten. Referring to FIG. 1, for example, the coverage of the tungsten layer on the bottom and sidewalls of trench 12 is virtually identical on the coverage on the top surface of the substrate. Without a diborane pretreatment, the nucleation delay for an ALD process using $WF_6$ can be very slow, measured even in days. With the diborane pretreatment the nucleation delay approaches zero.

Figure 7A:
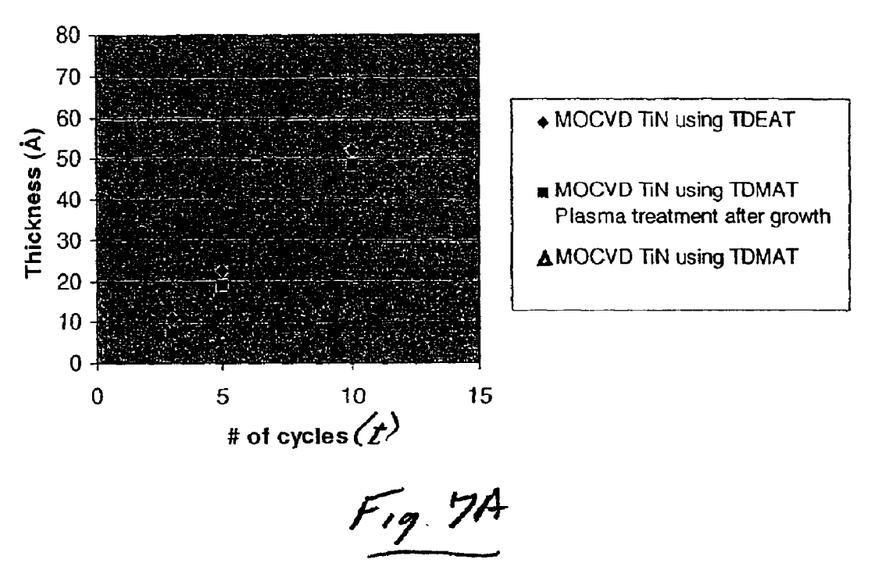
FIG. 7A is a graph illustrating the formation of a tungsten nucleation layer on various types of titanium nitride layers without a diborane pretreatment.

Ordinarily, the nucleation of tungsten is extremely sensitive to the surface condition of the substrate. Irregularities in the surface can cause non-uniform nucleation. This is illustrated in FIG. 7A, which is a graph of the thickness of a tungsten layer as a function of the number of cycles (i.e., time). The tungsten was deposited on a layer of TiN that was formed by three different processes. The solid diamonds refer to a layer of TiN deposited by a metal organic CVD process using tetrakisdiethylamino-titanium (TDEAT) as a precursor, the open triangles refer to a layer of TiN deposited by a metal organic CVD process using tetrakisdimethylamino-titanium (TDMAT) as a precursor; the solid squares refer to a layer of TiN deposited by a metal organic CVD process using TDMAT as a precursor, with a plasma treatment after the growth of the TiN layer. It is evident from FIG. 7A that the nucleation time differed considerably depending on the process used to deposit the underlying TiN layer.

Figure 7B:
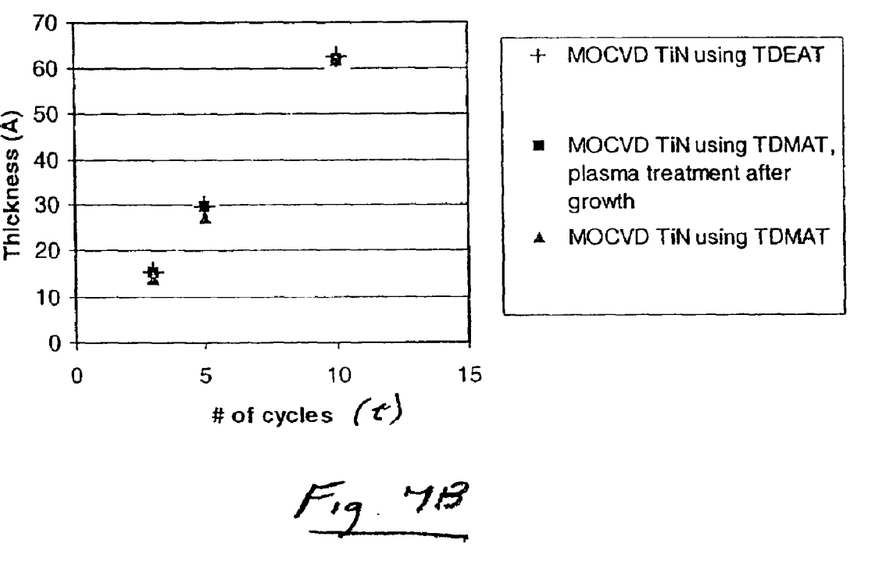
FIG. 7B is a graph illustrating the formation of a tungsten nucleation layer on various types of titanium nitride layers with a diborane pretreatment.

FIG. 7B shows the results when the TiN layers were treated with diborane for one second, as described above, before the tungsten nucleation layer was deposited. The +'s refer to a layer of TiN deposited by a metal organic CVD process using TDEAT; the solid triangles refer to a layer of TiN deposited by a metal organic CVD process using TDMAT; the solid squares refer to a layer of TiN deposited by a metal organic CVD process using TDMAT with a plasma treatment after the growth of the TiN layer. A comparison of FIGS. 7A and 7B shows that the use of the diborane pretreatment before the formation of the tungsten nucleation layer reduced the nucleation delay to almost zero for all three TiN layers.

Figure 8A:
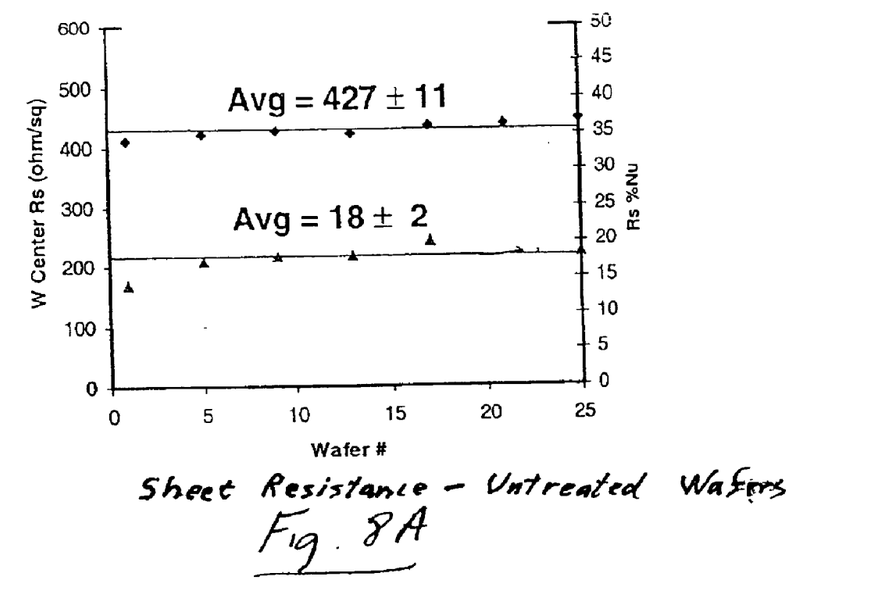
FIGS. 8A and 8B are graphs showing a comparison of the uniformity of the sheet resistance of a tungsten layer on two groups of wafers that were untreated and were pretreated with diborane, respectively.
Figure 8B:
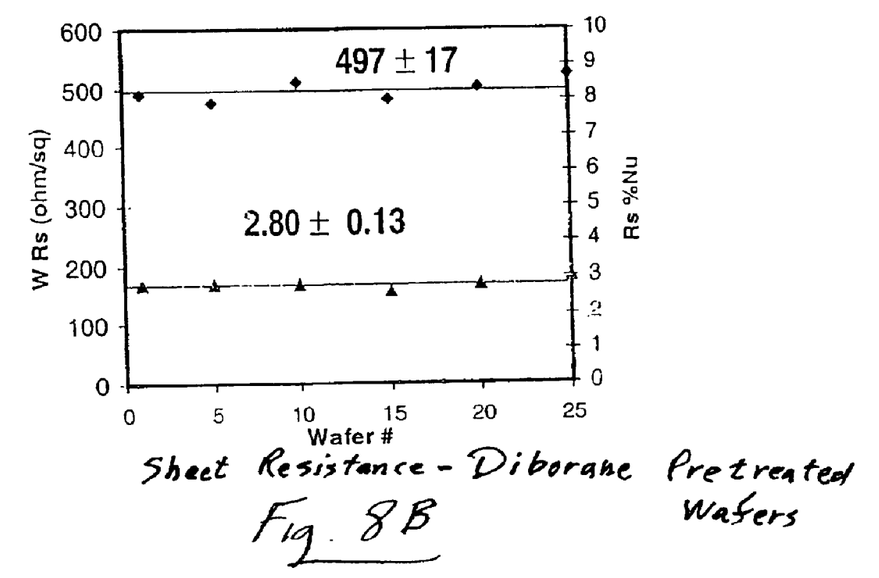

The graphs of FIGS. 8A and 8B show data for the tungsten films on two groups of 25 wafers each. The tungsten films on the wafers in both groups were deposited using an ALD process performed in a Novellus Altus™ CVD reactor. The wafers represented in FIG. 8B were pretreated with diborane before the tungsten film was deposited. The wafers represented in FIG. 8A were untreated. In both figures the diamonds show the average sheet resistance for each wafer in the group (left scale) and the triangles show the percent variation of the sheet resistance within each wafer in the group (right scale). Of importance, the percent variation of the sheet resistance of the tungsten film within the diborane pretreated wafers averaged only 2.80±0.13 whereas the percent variation of the sheet resistance within the untreated wafers averaged 18±2. A percent variation of the sheet resistance less than about 3 is considered to be very good.

Figure 9A:
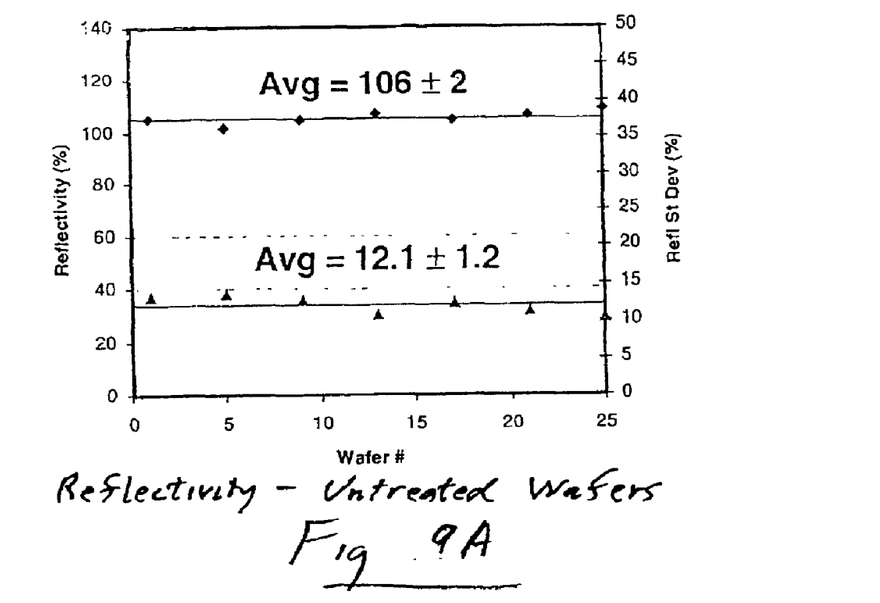
FIGS. 9A and 9B are graphs showing a comparison of the uniformity of the reflectivity of a tungsten layer on two groups of wafers that were untreated and were pretreated with diborane, respectively.
Figure 9B:
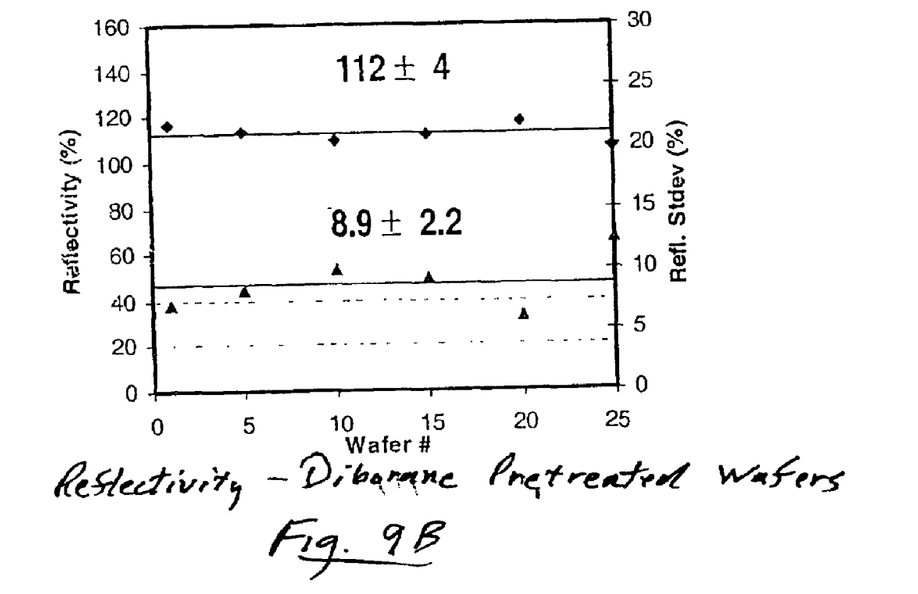

FIGS. 9A and 9B are similar to FIGS. 8A and 8B except that the diamonds show the average reflectivity of each wafer in the group (left scale) and the triangles show the standard deviation of the reflectivity within each wafer in the group (right scale). For the diborane pretreated wafers the standard deviation of the reflectivity averaged only 8.9±2.2 whereas for the untreated wafers the standard deviation of the reflectivity averaged 12.1±1.2.

Figure 10A:
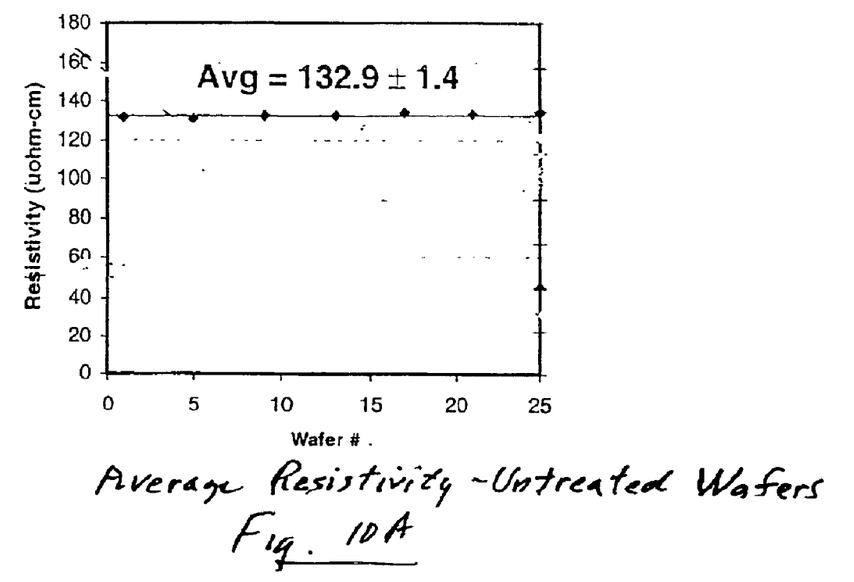
FIGS. 10A and 10B are graphs showing a comparison of the average resistivity of a tungsten layer on two groups of wafers that were untreated and were pretreated with diborane, respectively.
Figure 10B:
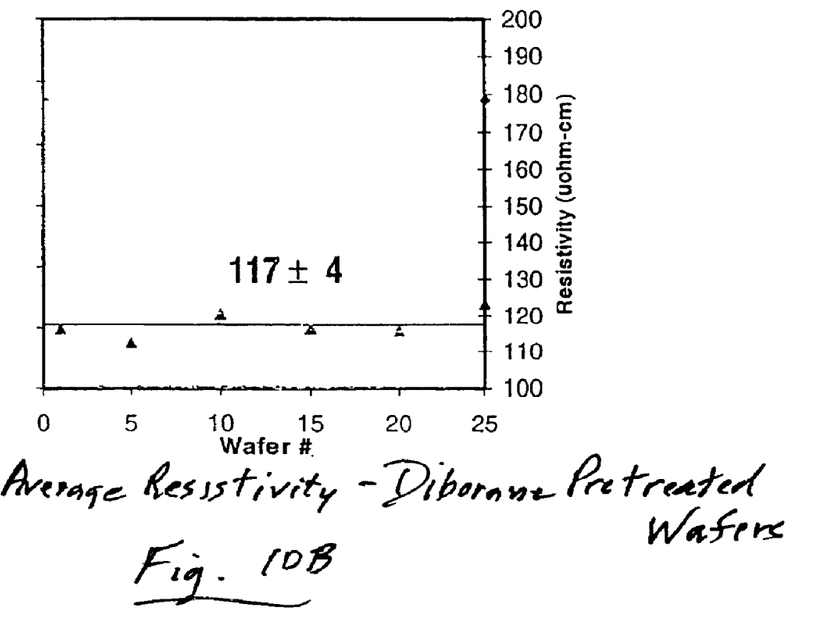

FIG. 10A shows the average resistivity of the tungsten film on each wafer in the untreated group (left scale) and FIG. 10B shows the average resistivity of the tungsten film on each wafer in the diborane pretreated group (right scale). The resistivity for the untreated wafers averaged 132.9±1.4 whereas the resistivity for the diborane pretreated wafers averaged only 117±4, a significant improvement over the untreated wafers.

Figure 11:
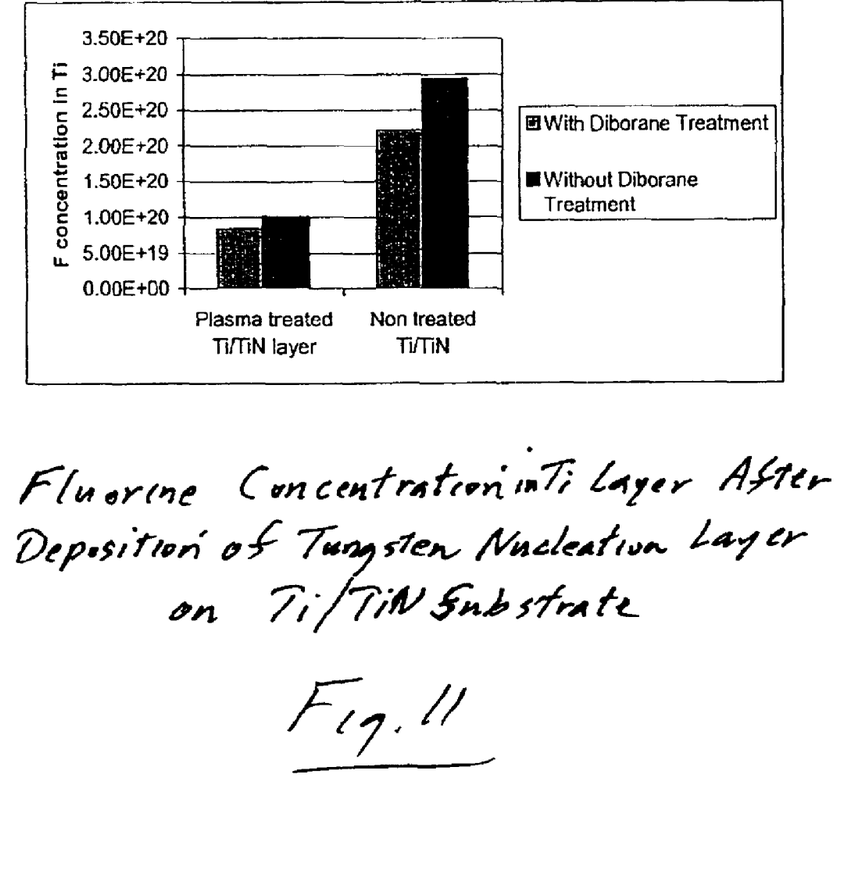
FIG. 11 is a graph showing the results of a SIMS analysis of the fluorine concentration in a Ti/TiN layer on wafers that were untreated and wafers that were treated with diborane, respectively.

Similar improvements are found in the reduction of the fluorine concentration in a titanium underlayer with a diborane treatment. The fluorine concentration inside an underlying titanium layer is significantly reduced by the diborane pretreatment. FIG. 11 shows the effect of a diborane pretreatment on a Ti/TiN bilayer that has been treated with a hydrogen plasma (left side) and on a Ti/TiN bilayer that has not been treated with a hydrogen plasma (right side). In both cases, the diborane treatment reduced the concentration of fluorine in the Ti/TiN layer.

U.S. Pat. No. 6,156,382 to Rajagopalan et al. describes the use of diborane in a CVD process for depositing tungsten but the diborane is introduced "between the nucleation and bulk deposition steps" (col. 1, line 55). According to the present invention, the diborane pretreatment is undertaken before the nucleation step. There is no suggestion of such a process in the Rajagopalan et al. patent.

This description should be viewed as illustrative and not limiting. For example, other boron hydrides in addition to diborane can be used in the pretreatment step. Examples are: $B_4H_{10}$, $B_5H_9$, $B_5H_{11}$, $B_6H_{10}$, $B_6H_{12}$, $B_9H_{15}$, $B_{10}H_{14}$, $B_{20}H_{16}$. The diborane pretreatment can be used on any surface on which a tungsten film is to be formed, including, for example, silicon, silicon dioxide, silicon nitride and titanium nitride. As an alternative to $WF_6$, other tungsten-containing gases such as $WCl_6$ and $W(CO)_6$ may be used as the tungsten source. As an alternative to $SiH_4$ and $H_2$ other reducing gases such as $Si_2H_6$ or $B_2H_6$ may be used. Many other alternatives and variations of the processes described above will be apparent to those skilled in the art.

We claim:

1. A method of forming a tungsten nucleation layer comprising:

placing a substrate in a reaction chamber;

generating atomic hydrogen;

exposing the substrate to the atomic hydrogen;

evacuating the atomic hydrogen from the reaction chamber;

introducing a tungsten-containing gas into the reaction chamber so as to form a tungsten nucleation layer on the substrate.

2. The method of claim 1 wherein generating atomic hydrogen comprises utilizing a downstream hydrogen plasma source.

3. The method of claim 2 wherein utilizing a downstream hydrogen plasma source comprises coupling radio frequency (RF) energy into a plasma.

4. The method of claim 2 wherein utilizing a downstream hydrogen plasma source comprises coupling direct current (DC) energy into a plasma.

5. The method of claim 1 wherein generating atomic hydrogen comprises utilizing a hot filament.

6. The method of claim 1 wherein generating atomic hydrogen comprises utilizing an ultraviolet (UV) lamp.

7. The method of claim 1 wherein generating atomic hydrogen comprises utilizing a laser.

8. The method of claim 1 comprising exposing the substrate to a gas selected from the group consisting of $SiH_4$ and $Si_2H_6$ after exposing the substrate to atomic hydrogen and before introducing a tungsten-containing gas into the reaction chamber.

9. The method of claim 1 wherein introducing a tungsten-containing gas comprises introducing $WF_6$ and a reducing gas.

10. The method of claim 9 wherein the reducing gas comprises $S_1$—$H_4$.

11. The method of claim 9 wherein the reducing gas comprises $Si_2H_6$.

12. The method of claim 9 wherein the $WF_6$ and reducing gas are introduced into the chamber simultaneously.

13. The method of claim 9 wherein the $WF_6$ and reducing gas are introduced into the chamber sequentially.

14. The method of claim 1 comprising forming a bulk tungsten layer on top of the tungsten nucleation layer.

15. The method of claim 14 wherein forming a bulk tungsten layer comprises introducing $WF_6$ and $H_2$.

16. The method of claim 1 comprising introducing argon into the reaction chamber at least during exposing the substrate to the atomic hydrogen and during introducing a tungsten-containing gas into the reaction chamber.

17. The method of claim 1 comprising:

forming a bulk tungsten layer on top of the tungsten nucleation layer, and introducing argon into the reaction chamber at least during exposing the substrate to the atomic hydrogen, during introducing a tungsten-containing gas into the reaction chamber so as to form a tungsten nucleation layer and during forming a bulk tungsten layer.

18. A method of forming a tungsten nucleation layer comprising:

placing a substrate in a reaction chamber;

introducing a flow of a boron hydride-containing gas into the reaction chamber;

terminating the flow of the boron hydride-containing gas; and after terminating the flow of the boron hydride-containing gas, forming a tungsten nucleation layer on the substrate.

19. The method of claim 18 wherein forming a tungsten nucleation layer comprises using a chemical vapor deposition process.

20. The method of claim 19 wherein using a chemical vapor deposition process comprises introducing a tungsten source gas and a reducing gas into the reaction chamber simultaneously.

21. The method of claim 20 wherein the tungsten source gas is selected from the group consisting of $WF_6$, $WCl_6$ and $W(CO)_6$.

22. The method of claim 20 wherein the tungsten source gas comprises $WF_6$.

23. The method of claim 20 wherein the reducing gas is selected from the group consisting of $H_2$, $SiH_4$, $Si_2H_6$ and $B_2H_6$.

24. A method of claim 20 wherein the reducing gas comprises $SiH_4$.

25. The method of claim 18 comprising forming a bulk tungsten layer on top of the tungsten nucleation layer.

26. The method of claim 25 wherein forming a bulk tungsten layer comprises introducing a flow of $WF_6$ and $H_2$ into the reaction chamber.

27. The method of claim 18 wherein the boron hydride-containing gas comprises a gas selected from the group consisting of $B_2H_6$, $B_4H_{10}$, $B_5H_9$, $B_5H_{11}$, $B_6H_{10}$, $B_6H_{12}$, $B_9H_{15}$, $B_{10}H_{14}$, and $B_{20}H_{16}$.

28. The method of claim 18 wherein the boron hydride-containing gas comprises $B_2H_6$.

29. A method of forming a tungsten nucleation layer comprising:

placing a substrate in a reaction chamber;

introducing a flow of a boron hydride-containing gas into the reaction chamber;

terminating the flow of the boron hydride-containing gas; and after terminating the flow of the boron hydride-containing gas, forming a tungsten nucleation layer on the substrate;

wherein forming a tungsten nucleation layer comprises using an atomic layer deposition process.

30. The method of claim 29 wherein using an atomic layer deposition process comprises:

introducing a flow of a tungsten source gas into the reaction chamber;

terminating the flow of the tungsten source gas;

introducing a flow of a reducing gas into the reaction chamber; and terminating the flow of the reducing gas.

31. The method of claim 30 wherein the tungsten source gas is selected from the group consisting of $WF_6$, $WCl_6$ and $W(CO)_6$.

32. The method of claim 30 wherein the tungsten source gas comprises $WF_6$.

33. The method of claim 30 wherein the reducing gas is selected from the group consisting of $H_2$, $SiH_4$, $Si_2H_6$ and $B_2H_6$.

34. The method of claim 30 wherein the reducing gas comprises $SiH_4$.

* * * * *